United States Patent
Bohr et al.

[11] Patent Number: 5,911,111
[45] Date of Patent: Jun. 8, 1999

[54] POLYSILICON POLISH FOR PATTERNING IMPROVEMENT

[75] Inventors: Mark T. Bohr, Aloha; Lawrence N. Brigham, Beaverton; Peter K. Moon, Portland; Seiichi Morimoto, Beaverton, all of Oreg.

[73] Assignee: Intel Corporation, Santa Clara, Calif.

[21] Appl. No.: 08/944,041

[22] Filed: Sep. 2, 1997

Related U.S. Application Data

[63] Continuation of application No. 08/394,368, Feb. 24, 1995, abandoned.

[51] Int. Cl.$^6$ .................................................... H01L 21/44
[52] U.S. Cl. ......................... 438/585; 438/592; 438/692; 438/693
[58] Field of Search .................................... 438/585, 592, 438/692, 693

[56] References Cited

U.S. PATENT DOCUMENTS

| | | |
|---|---|---|
| 3,664,874 | 5/1972 | Epstein . |
| 4,702,792 | 10/1987 | Chow et al. . |
| 4,758,306 | 7/1988 | Cronin et al. . |
| 4,879,258 | 11/1989 | Fisher . |
| 4,944,836 | 7/1990 | Beyer et al. . |
| 4,954,142 | 9/1990 | Carr et al. . |
| 4,992,135 | 2/1991 | Doan . |
| 5,030,584 | 7/1991 | Nakata ..................................... 437/44 |
| 5,036,015 | 7/1991 | Sandhu et al. . |
| 5,209,816 | 5/1993 | Yu et al. . |
| 5,232,875 | 8/1993 | Tuttle et al. . |
| 5,244,534 | 9/1993 | Yu et al. . |
| 5,271,798 | 12/1993 | Sandhu et al. . |
| 5,346,587 | 9/1994 | Doan et al. .............................. 156/657 |
| 5,391,511 | 2/1995 | Doan et al. ............................... 437/49 |
| 5,422,289 | 6/1995 | Pierce ........................................ 437/32 |
| 5,476,606 | 12/1995 | Brancaleoni et al. .................. 252/79.1 |
| 5,487,931 | 1/1996 | Annacone et al. ..................... 428/64.1 |
| 5,489,543 | 2/1996 | Hong ......................................... 437/40 |
| 5,502,008 | 3/1996 | Hayakawa et al. ..................... 437/225 |
| 5,563,096 | 10/1996 | Nasr ......................................... 437/40 |

FOREIGN PATENT DOCUMENTS 0545263  6/1993  European Pat. Off. .

OTHER PUBLICATIONS

Wolf, Stanley, "Silicon Processing for the VLSI Era", vol. 2, pp. 333–334.

Sivaram, S., Underlayer Dependence of Thin Film Stresses in Blanket CVD Tungsten, *Tungsten & Other Refractory Metals for VLSI Applications III*, 1987, pp. 407–414.

Kaufman, F.B. et al., Chemical–Mechanical Polishing for Fabricating Patterned W Metal Features as Chip Interconnects, *J. Electrochem Soc.*, vol. 138, No. 11, Nov. 1991, pp. 3460–3465.

Landis, H., et al., Integration of Chemical–Mechanical Polishing into CMOS integrated Circuit Manufacturing, *Thin Solid Films*, 220, (1992), pp. 1–7.

*Primary Examiner*—Charles Bowers
*Assistant Examiner*—Matthew Whipple
*Attorney, Agent, or Firm*—Blakely, Sokoloff, Taylor & Zafman LLP

[57] ABSTRACT

A polishing process for polysilicon gate patterning improvement using standard patterning techniques in the manufacture of high performance metal oxide semiconductor (MOS) devices. The addition of a short silicon polish step, after deposition and before patterning of a polysilicon layer reduces the non-planarity normally associated with polysilicon. Polysilicon polishing removes the surface roughness in the polysilicon layer caused by the grain structure of polysilicon and the surface roughness due to the replication of the underlying topography of the isolation and substrate regions. The described method for removal of both types of surface roughness leaves the polysilicon layer planarized without increasing the defect level already associated with the manufacture of high performance MOS devices.

12 Claims, 5 Drawing Sheets

POLYSILICON POLISH FOR PATTERNING IMPROVEMENT

This is a continuation of application Ser. No. 08/394,368, filed Feb. 24, 1995, now abandoned.

BACKGROUND OF THE INVENTION

1. Field of the Invention

This invention relates to the field of semiconductor devices, and more specifically, to a process designed to improve surface planarity of polysilicon gate layers.

2. Background Information

In order to fabricate high performance metal oxide semiconductor (MOS) transistors, it is crucial to control gate electrode linewidths. Improved control of the gate electrode linewidth allows the formation of smaller channel lengths and increases the performance of MOS transistors. Non-planar polysilicon layer surfaces degrade the ability to control linewidths during lithographic processing for gate patterning. This degradation of control is generally due to variations in photoresist thickness and irregular light reflections off the polysilicon surface.

Polycrystalline silicon (polysilicon) is a preferred gate electrode material for MOS devices because it is easy to deposit and easy to dope. Polysilicon, however, also has disadvantages that interfere with lithographic patterning and decrease linewidth control. One disadvantage is that polysilicon, due to its grain structure, forms a relatively rough surface layer. Another disadvantage is that the remaining topography from the underlying isolation structures is replicated in the polysilicon surface. Both of these disadvantages interfere with lithographic patterning and degrade linewidth control.

FIG. 1a illustrates a cross sectional view of polysilicon layer 130 deposited above thin gate oxide layer 120, isolation regions 110 & 111, and substrate 100. The rough surface of polysilicon layer 130 caused by the grain structure of polysilicon is also illustrated in FIG. 1a. Additionally, the underlying topography of isolation regions 110 & 111 and substrate 100 are replicated in the surface of polysilicon layer 130. The rough surface and the underlying topography in polysilicon layer 130 cause reflection and scattering effects during photolithographic patterning of a photoresist.

FIG. 1b illustrates a cross sectional view of mask 150 and photoresist layer 140 coated on the polysilicon layer 130 of FIG. 1a. It is a well known process in the art to pattern polysilicon gate layers using a patterned photoresist. In order to pattern photoresist layer 140, mask 150 is used to block the light. As shown in FIG. 1b mask 150 only covers a portion of photoresist layer 140. The uncovered regions of photoresist layer 140 are exposed to light. Exposure to light causes the uncovered portions of photoresist layer 140 to become soluble. FIG. 1b illustrates mask 150 and photoresist layer 140 being exposed to light. Because the light rays are being reflected and scattered by the rough surface and underlying topography of polysilicon layer 130, regions of photoresist layer underlying the mask are exposed to light and become soluble.

The step height difference caused by underlying topography results in variations in the photoresist thickness as it covers the topography. This variation in photoresist thickness also contributes to increased variation in the linewidth control of the patterned photoresist layer due to thin film interference effects. In other words, when a thin photoresist film is exposed to light, internal reflection and interference can affect the light intensity thus degrading linewidth control.

After photoresist layer 140 has been subjected to a developing solution only the insoluble portions of photoresist layer 140 remain, as shown in FIG. 1c. The insoluble portions of photoresist layer are the portions of photoresist layer 140 not exposed to light. Due to the reflection and scattering of the light by polysilicon layer 130, photoresist layer 140 is poorly patterned. The features of photoresist layer 140 have poor edge definition and have varying horizontal dimensions.

The patterned photoresist is then used to pattern the polysilicon layer 130 into a gate electrode. Polysilicon gate layer 130 is patterned using well known etch techniques, such as, reactive ion etch (RIE), to form a polysilicon gate electrode as shown in FIG. 1d. Because the patterned photoresist layer 140 (in FIG. 1c) has wavy edges and varying horizontal dimensions, the gate electrode 130 in FIG. 1d is formed with poor edge definition and varying linewidth. Therefore, the poorly patterned photoresist layer can cause the gate electrode to be formed with varying gate-lengths. FIG. 1e illustrates a top view of the gate electrode 130 in FIG. 1d.

The variation in gate-length of the gate electrode can cause variations in channel length. Variation of the channel length varies the electrical characteristics of an MOS device and must be carefully controlled.

Presently there are two techniques for improving gate electrode linewidth control in the manufacture of high performance MOS transistors. The first technique is known as amorphous silicon deposition. Amorphous silicon deposition eliminates the surface roughness caused by the grain structure of polysilicon but does not eliminate the replication of underlying isolation topography in the polysilicon surface. Additionally, amorphous silicon deposition has problems with deposition defects and is also more difficult to fully dope.

The second technique for improving linewidth control is the use of anti-reflective layers as part of the lithographic process. The use of anti-reflective layers reduces the effects of both the surface roughness caused by the grain structure of polysilicon and the resist thickness variation due to the underlying topography. An anti-reflective layer is highly absorbing and reduces the reflection and scattering effects caused by the rough surface and the topographical features of the polysilicon layer. The addition of an anti-reflective layer also helps to planarize the isolation topography and reduce the variation of the photoresist thickness. Anti-reflective layers, however, require special processing equipment and add additional steps, i.e. depositing and etching the anti-reflective layer. The need for special processing equipment significantly increases the cost of manufacturing the MOS transistors. Also, the additional steps required by the use of anti-reflective layers increases the defect level normally associated with the production of MOS transistors.

Thus, what is needed is a method that removes both sources of non-planarity associated with polysilicon and that improves linewidth control using standard lithographic techniques without increasing the defect level already associated with the manufacture of high performance MOS transistors.

SUMMARY OF THE INVENTION

The present invention describes a method for improved linewidth control in the patterning of polysilicon layers, which are used to form gate electrodes, in the manufacture of metal oxide semiconductor (MOS) devices. The preferred embodiment of the present invention employs a short polysilicon polish step after deposition and before patterning of a polysilicon layer. This polysilicon polish step removes the two sources of non-planarity normally associated with polysilicon. In other words, the present invention removes surface roughness in the polysilicon layer caused by the grain structure of polysilicon and the surface roughness due to the replication of the underlying topography of the isolation and substrate regions.

A currently preferred embodiment of the present invention utilizes a polisher to polish the polysilicon layer. A colloidal silica with potassium hydroxide ($SiO_2$/KOH) slurry is dispensed onto the pad of the polisher. The polishing pressure is kept at approximately 0.5–3.0 psi to maintain a low polish rate. The polishing pad rotation is maintained at approximately 10–100 rpm and the carrier rotation is maintained at approximately 10–100 rpm. The polishing pad and slurry are chilled with water to maintain a temperature of approximately 20° C. during the process. The polishing process of this currently preferred embodiment is continued until approximately 1000 Å of the 3000–5000 Å polysilicon layer is removed.

A goal of the present invention is to eliminate surface roughness caused by the grain structure of polysilicon in the manufacture of high performance MOS transistors.

Another goal of the present invention is to remove the replication of the underlying topography in a polysilicon surface in the manufacture of high performance MOS transistors.

Still another goal of the present invention is to improve gate patterning of the polysilicon layer in the manufacture of high performance MOS transistors.

A further goal of the present invention is to pattern a polysilicon layer using standard lithographic techniques without increasing the defect level normally associated with the manufacture of high performance MOS transistors.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures and in which:

FIG. 2b illustrates a cross sectional view of a gate oxide layer formed above the substrate of FIG. 2a.

DETAILED DESCRIPTION

A polysilicon polish for patterning improvement is disclosed. In the following description, numerous specific details are set forth such as specific materials, equipment, process parameters, thicknesses, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a process for improving linewidth control in the manufacture of high performance metal oxide semiconductor (MOS) transistors. In the manufacture of high performance MOS transistors and more specifically after the deposition of a silicon layer used to form a gate electrode, the present invention is employed to remove all sources of non-planarity in the surface of the silicon layer. The removal of all sources of non-planarity in the surface of the silicon layer used to form the gate electrode improves linewidth control during the lithographic patterning of a photoresist. Improved linewidth control in patterning the photoresist helps to control the formation and patterning of gate electrodes and other subsequent processing layers. Improved control over the patterning of gate electrodes allows the formation of smaller channel lengths and increases the performance of MOS transistors.

It is to be noted that the term "substrate" is used throughout the present disclosure. Substrate is used to refer to a silicon semiconductor substrate or a part thereof, such as, gallium arsenide. The term substrate includes, but is not limited to: fully processed, semi-processed, or unprocessed substrates with semiconductor materials thereon.

Figure 1A:
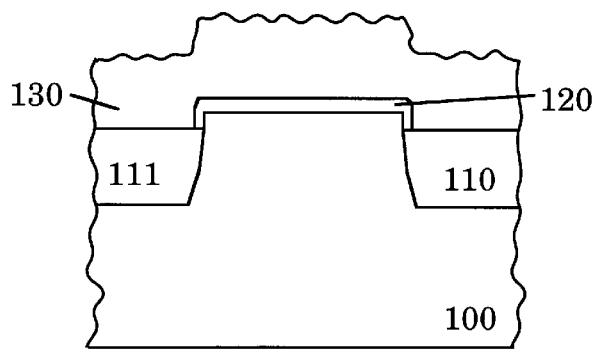
FIG. 1a illustrates a cross sectional view of a polysilicon layer deposited above a gate oxide layer, isolation regions, and substrate.
Figure 1B:
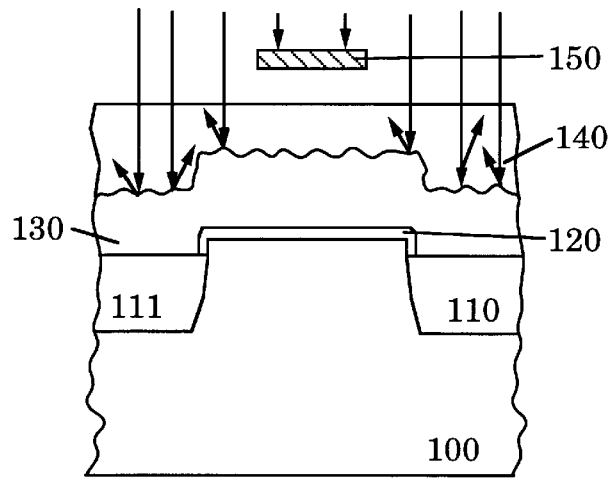
FIG. 1b illustrates a cross sectional view of a mask and a photoresist layer coated on the polysilicon layer of FIG. 1a during exposure to light.
Figure 1C:
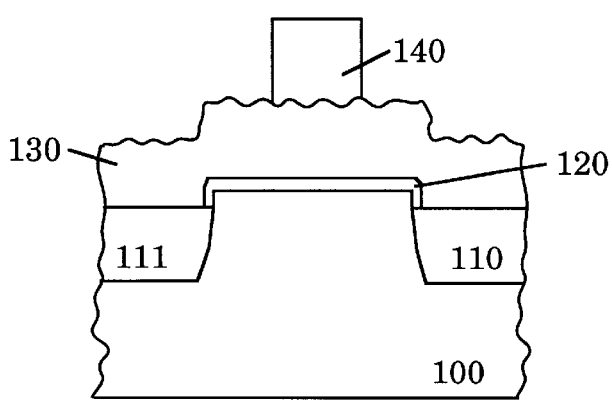
FIG. 1c illustrates a cross sectional view of the photoresist layer of FIG. 1b after patterning.
Figure 1D:
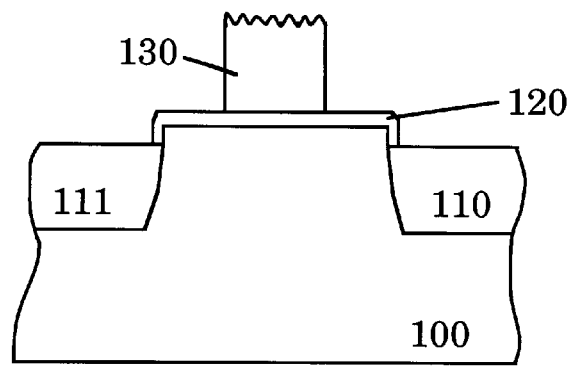
FIG. 1d illustrates a cross sectional view of the photoresist layer of FIG. 1c after patterning into a gate electrode.
Figure 1E:
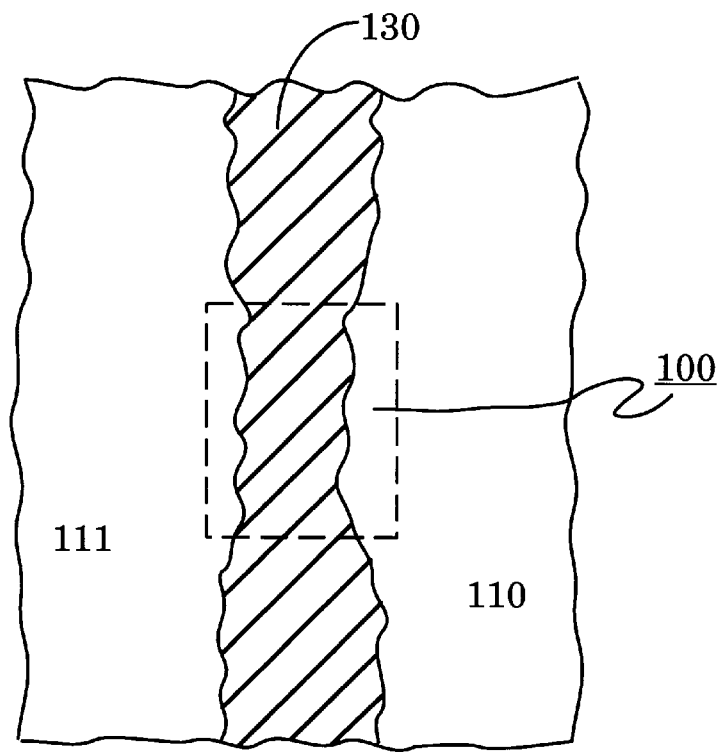
FIG. 1e illustrates a top view of the gate electrode 130 in FIG. 1d.
Figure 2A:
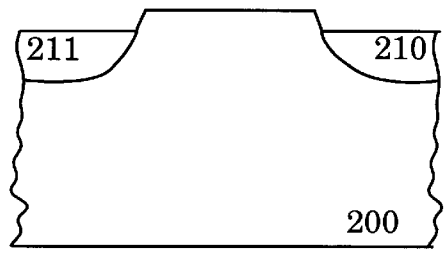
FIG. 2a illustrates a cross sectional view of isolation regions formed in a substrate.

The general processing steps used in the manufacture of a MOS transistor are well known in the art and will be obvious to one with skill in the art, therefore, these steps are not described in detail. FIG. 2a illustrates field oxide regions (isolation structures) 210 and 211 formed in substrate 200. In a currently preferred embodiment the field oxide regions 210 and 211 are formed by shallow trench isolation, however, it should be noted that they may also be formed by other methods, such as, LOCOS isolation.

Figure 2B:
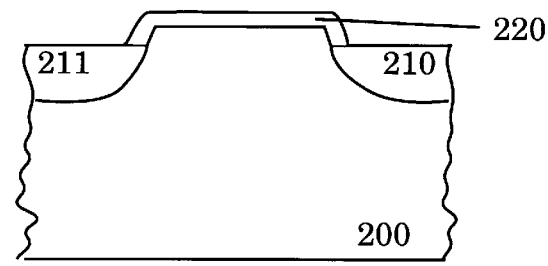

FIG. 2b illustrates a thin gate oxide layer 220 formed on substrate 200. It should be noted that the thin gate oxide layer referred to in the description of the present invention is also known in the art as a gate dielectric layer. In a currently preferred embodiment the thin gate oxide comprises $SiO_2$.

After the thin gate oxide is formed a silicon layer is deposited. The silicon layer may consist of polycrystalline silicon (polysilicon) or an amorphous silicon. A preferred embodiment of the present invention utilizes a polysilicon layer. Although the following description describes the present invention with respect to the formation of silicon and polysilicon gates, it should be noted that the present invention can also be utilized with other gate materials that have a granular surface morphology, such as tungsten. It should also be noted that the present invention can be utilized to form composite gates. Such composite gates may include, but are not limited to, polysilicon with a refractory metal film (for example, tungsten) or polysilicon with a silicide film (for example, tungsten silicide). In other words, a composite layer structure (e.g., the polysilicon film with the refractory metal film or polysilicon with the silicide film) is formed prior to a step of polishing the polysilicon layer. After the polysilicon polish step, the composite layer structure is patterned into a composite gate.

Additionally, it should be noted that the present invention can be utilized to form gate electrodes from pure metal layers that have a granular surface morphology, for example, tungsten layers. Tungsten, like polysilicon, due to its grain structure, forms a relatively rough surface layer which can interfere with lithographic patterning of the gate electrode. Thus, the present invention can be utilized to substantially eliminate the surface roughness and replication of underlying topography in the formation of composite layers. Where an additional layer, for example, a tungsten film or tungsten silicide film, is deposited on top of the silicon or polysilicon layer to form a composite layer, a polishing step may be performed after the deposition of the additional layer thereby removing the surface roughness and replication of underlying topography of the composite layer.

Figure 2C:
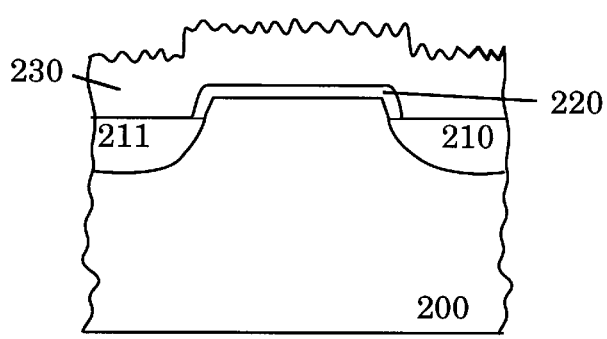
FIG. 2c illustrates a cross sectional view of a polysilicon layer deposited above the oxide layer of FIG. 2.

FIG. 2c illustrates a polysilicon layer 230 deposited above thin gate oxide layer 220. The rough surface of polysilicon layer 230 caused by the grain structure of polysilicon is illustrated in FIG. 2c. Additionally, the underlying topography of field oxide regions 210 & 211 and substrate 200 are replicated in the surface of polysilicon layer 230. The rough surface and the replication of the underlying topography in polysilicon layer 230 cause reflection and scattering effects which degrade linewidth control during subsequent photolithographic patterning of a photoresist layer. In other words, the photoresist is poorly patterned.

The photoresist is used to pattern the polysilicon layer into a gate electrode. A poorly patterned photoresist causes the formation of non-uniform gate electrodes. Non-uniform gate electrode linewidth, in turn, causes non-uniform transistor channel lengths and prevents the formation of small channel lengths, thus causing a decrease in device performance. It is therefore advantageous to employ the present invention before subjecting the polysilicon layer to a photoresist and etch (patterning) process.

According to the present invention a short silicon polish step is used after polysilicon deposition and before patterning, to remove all sources of non-planarity in the polysilicon surface. Removing all sources of non-planarity in the polysilicon layer reduces reflection and scattering effects during photolithography and provides a constant resist thickness across a printed field improving the patterning of the photoresist layer. Since the photoresist is used to pattern the gate electrode, and improved photoresist permits uniform formation of the gate electrode. Uniform gate electrode linewidth permits more uniform transistor channel length and allows the formation of smaller channel lengths which ultimately increase device performance.

Figure 2D:
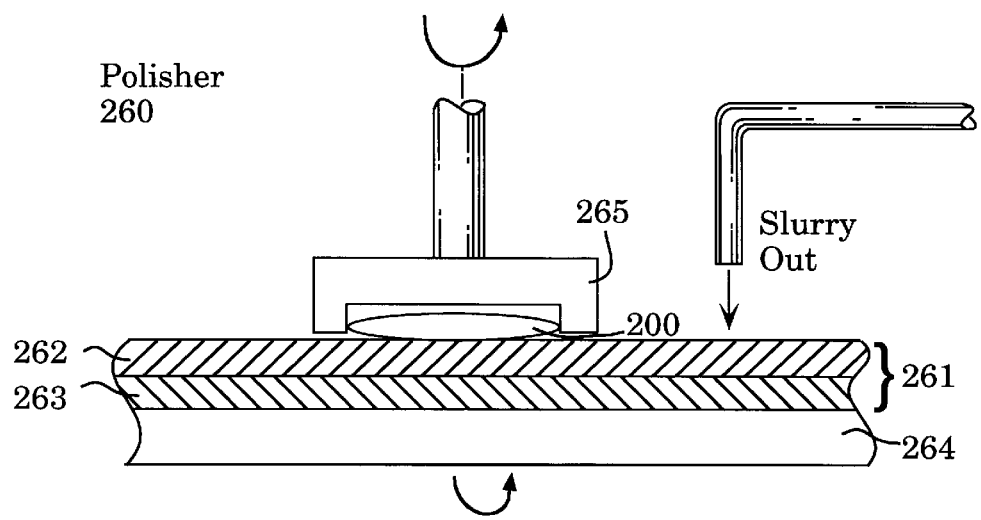
FIG. 2d illustrates a cross sectional view of a polisher.

After polysilicon layer 230 has been deposited on substrate 200, substrate 200 is then placed into carrier 265 of polisher 260 as shown in FIG. 2d. A preferred embodiment of the present invention utilizes a Westech Polisher which is available from Ipec-Westech Corporation, Phoenix, Arizona.

The Westech Polisher 260 comprises carrier 265, polishing pad 261, and table 264. Carrier 265 holds substrate 200. Table 264 holds polishing pad 261. During polishing a slurry is dispensed onto polishing pad 261, carrier 265 presses substrate 200 onto polishing pad 261, and carrier 265 and polishing pad 261 are rotated. It should be noted that, since carrier 265 is holding substrate 200, substrate 200 is also being rotated The slurry breaks down the surface bonding of polysilicon layer 230 and the abrasion between polishing pad 261 and substrate 200 remove portions of the surface of polysilicon layer 230 by chemical mechanical polishing.

It should be noted that although the following description of the present invention describes the polysilicon polish with respect to the Westech Polisher it will be obvious to one with ordinary skill in the art that other polishers may be used. It should also be noted that although a preferred embodiment of the present invention utilizes rotational chemical mechanical polishing it will be obvious to one with ordinary skill in the art that other non-rotational chemical mechanical polishing techniques, such as orbital polishing, may be used.

During the polishing process a slurry is dispensed directly onto the polishing pad 261 of the polisher 260. One preferred embodiment of the present invention utilizes a silica with potassium hydroxide ($SiO_2$/KOH) slurry. It will be obvious to one with skill in the art that other similar slurries may be used, for example, a slurry incorporating ammonium hydroxide rather than potassium hydroxide may be used. The preferred embodiment of the present invention uses a $SiO_2$/KOH slurry which has a pH level in the range of approximately 9.5 to 12.0. It should also be noted that the $SiO_2$/KOH slurry must contain enough KOH to loosen the surface bonding of the polysilicon layer thereby enabling chemical mechanical polishing. In a currently preferred embodiment the slurry concentration comprises approximately 1–20% $SiO_2$ by weight.

Carrier 265, which holds substrate 200, presses polishing pad 261 so that polysilicon layer 230 contacts polishing pad 261. Polishing pad 261, used in a preferred embodiment of the present invention, is a dual layer polishing pad. Top pad 262 is a hard pad comprising, for example, polyurethane and bottom pad 263 is a soft pad comprising, for example, polyurethane. The hard pad provides better planarization of the surface layer while the soft pad provides better control of the uniformity across the substrate. A preferred embodiment of the present invention utilizes an IC-1000 pad as top pad 262 and a Suba-4 pad as bottom pad 263. Both pads comprise polyurethane and are available from Rodel Incorporated in Scottsdale, Ariz.

The Westech Polisher, although primarily designed for oxide polishing, may be used for polysilicon polishing with careful control of the polishing parameters. Some of the parameters to be controlled are: the polishing pressure, the rotation of polishing pad 261, and the rotation of carrier 265.

The pressure with which carrier 265 presses substrate 200 onto polishing pad 261 is referred to as the polishing pressure. The polishing pressure controls the polish rate. In other words, the higher the polishing pressure the higher the polish rate and the lower the polishing pressure the lower the polish rate. For polysilicon polishing a low polish rate is desired in order to remove a thin layer, because it allows greater control over the polishing process. The low polish pressure of the polishing process is particularly important when polishing polysilicon in order to prevent delamination of the polysilicon layer and to prevent damage to the thin gate oxide layer beneath the polysilicon layer. According to the present invention, the polishing pressure is maintained at approximately 0.5 to 3.0 psi.

The rotation of polishing pad 261 (polishing pad rotation) and the rotation of carrier 265 (carrier rotation) are also controlled. For polysilicon polishing, polishing pad 261 is rotated at approximately 10 to 100 rpm and substrate 200 is also rotated at approximately 10 to 100 rpm. In a currently preferred embodiment polishing pad 261 and carrier 265 are rotated in the same direction, however, it will be obvious to one with ordinary skill in the art that polishing pad 261 and carrier 265 can be rotated in the same or opposite direction of one another.

In a currently preferred embodiment of the present invention the temperature of the process is maintained at approximately 20° C. A low polishing temperature gives better planarization capability. It should be noted, however, that it will be obvious to one with ordinary skill in the art that the present invention can be utilized at any temperature. The temperature of the currently preferred embodiment is maintained by chilling the slurry and polishing pad with water.

The time or duration of the polysilicon polish step is directly proportional to the amount of surface roughness to be removed. The amount of surface roughness to be removed depends largely upon whether the surface roughness is caused by the grain structure of polysilicon or the underlying topography of the isolation and substrate regions. If the concern is only to remove the surface roughness due to the grain structure of polysilicon, then only a few hundred angstroms, approximately 100 to 500 Å, of the polysilicon layer need be removed. In a currently preferred embodiment approximately 400 Å of the polysilicon layer is removed. For greater linewidth control, surface roughness due to the underlying topography must also be removed. In this case, the amount of the polysilicon layer to be removed varies with the underlying topography and may range from approximately 500 to 2000 Å. In one currently preferred embodiment approximately 1000 Å of polysilicon is removed. It will be obvious to one with ordinary skill in the art, that by removing the surface roughness due to the underlying topography the surface roughness due to the grain structure of polysilicon is also removed. It should also be noted that the amount of polysilicon to be removed depends upon the thickness of the layer deposited. It will be obvious to one with ordinary skill in the art that when removing a portion of polysilicon layer 230, enough of polysilicon layer 230 must remain such that it will still act as a gate electrode and its resistivity will not be too high. Generally, the polysilicon layer is several thousand angstroms thick, approximately 3000 to 5000 Å, and removing 100 to 2000 Å of that layer for planarization (i.e. removing approximately 16–40% of the polysilicon layer) will not have an adverse effect on device manufacture or performance.

Figure 2E:
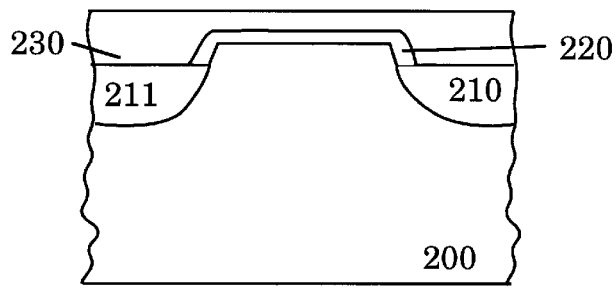
FIG. 2e illustrates a cross sectional view of the polysilicon layer of FIG. 2c after polishing.

FIG. 2e illustrates polysilicon layer 230 after polishing with the present invention. The surface roughness caused by the grain structure of polysilicon and the surface roughness due to the underlying topography of the isolation and substrate regions have been removed leaving the polysilicon layer planarized.

Figure 2F:
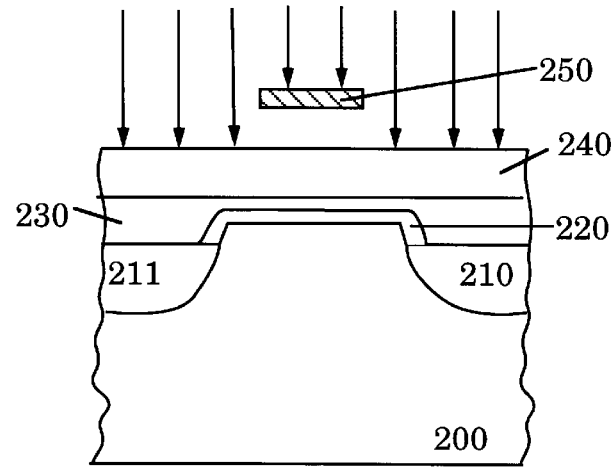
FIG. 2f illustrates a cross sectional view of a mask and a photoresist layer coated on the polysilicon layer of FIG. 2e during exposure to light.

Polysilicon layer 230 is then patterned into a gate electrode using a patterned photoresist. First, a photoresist layer 240 is coated on polysilicon layer 230 as illustrated in FIG. 2f. In order to pattern photoresist layer 240, mask 250 is used. As shown in FIG. 2f mask 250 only covers a portion of photoresist layer 240. The uncovered regions of photoresist layer 240 are exposed to light. Exposure to light causes the uncovered portions of photoresist layer 240 to become soluble. FIG. 2f illustrates the exposure of mask 250 and photoresist layer 240 to light. Since the polysilicon surface is planar the light rays are not being reflected and scattered, thus only the exposed regions of photoresist layer 240 become soluble. The planar polysilicon surface also ensures a uniform photoresist thickness and no variation in light intensity in the photoresist due to internal reflection and interference.

Figure 2G:
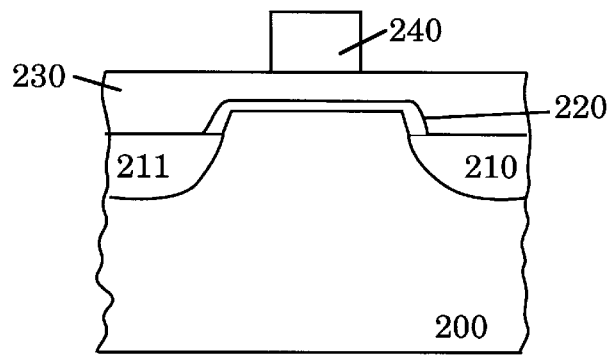
FIG. 2g illustrates a cross sectional view of the photoresist layer of FIG. 2f after patterning.

After photoresist layer 240 has been subjected to a developing solution only the insoluble portions of photoresist layer 240 remain, as illustrated in FIG. 2g. The insoluble portions of photoresist layer are the portions of photoresist layer 240 not exposed to light. Since the light was not reflected or scattered by polysilicon layer 230 and since the photoresist has a uniform thickness, photoresist layer 240 is properly patterned and has good definition. The patterned photoresist layer 240 has straight lines and uniform width.

Figure 2H:
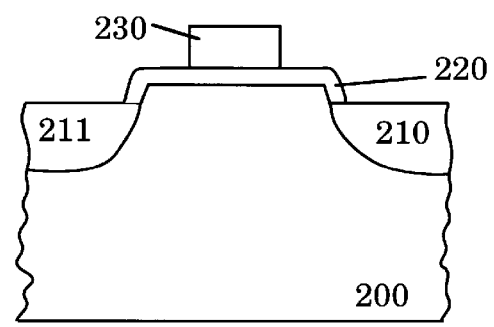
FIG. 2h illustrates a cross sectional view of the photoresist layer of FIG. 2g after patterning into a gate electrode.
Figure 2I:
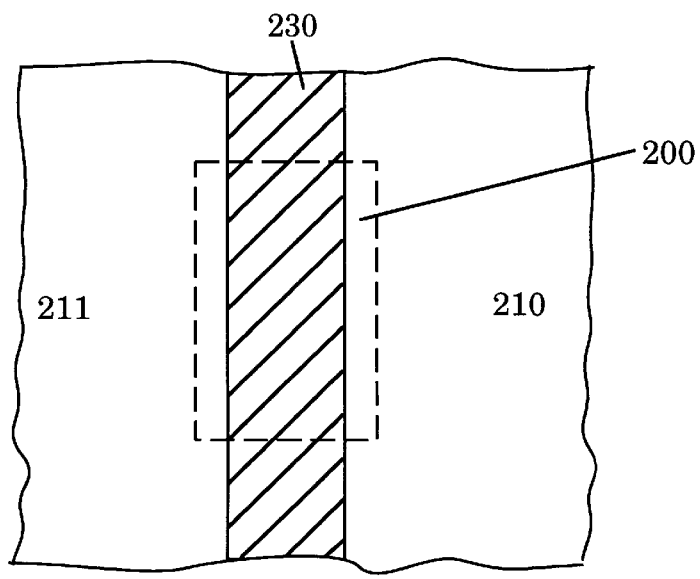
FIG. 2i illustrates a top view of gate electrode 230 in FIG. 2h.

The patterned photoresist is then used to pattern polysilicon layer 230 into a gate electrode. Polysilicon gate layer 230 is patterned using well known etch techniques, such as, reactive ion etch (RIE), to form a polysilicon gate electrode as illustrated in FIG. 2h. Because patterned photoresist layer 240 (in FIG. 2g) had straight edges and uniform width, the gate electrode 230 in FIG. 2h is formed with straight edges and a uniform gate length. FIG. 2i illustrates a top view of gate electrode 230 in FIG. 2h.

The present invention permits the formation of gate electrode 230 with straight edges and well-defined linewidth. The planarized polysilicon layer allows the gate-length dimension to be precisely maintained during patterning of the gate electrode. Maintaining the gate length is important because the channel length of an MOS device depends upon the gate length, thus, the smaller the gate length the smaller the channel length. The length of the gate and the channel length have a great impact on the electrical characteristics of an MOS device. The above described polysilicon polish planarizes the polysilicon layer without the use of expensive anti-reflective coatings (ARCs). Planarization of the polysilicon layer is advantageous for tighter linewidth control during lithographic patterning of a photoresist and for gate patterning improvement. The present invention may also be useful in the formation of composite gate electrodes, for example, composite gates comprising silicon, silicide, and refractory metal layers. Additionally, the present invention may be useful in the formation of silicon interconnect lines to allow greater control over the dimensions of the interconnect line structure.

Thus, a polysilicon polish for patterning improvement has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A process of fabricating an integrated circuit comprising the steps of:

depositing a layer comprising polysilicon above a substrate having an isolation region therein;

forming a tungsten film on said layer, wherein said tungsten film is deposited onto said layer prior to a step of polishing said layer;

polishing the surface of said layer such that surface roughness and replication of underlying topography are substantially eliminated and such that the polished surface of said layer extends over substantial portions of said isolation region; and patterning said layer.

2. The process as described in claim 1 wherein said layer further comprises a tungsten silicide film, wherein said tungsten silicide film is formed on said layer comprising polysilicon prior to said step of polishing said layer comprising polysilicon.

3. The process as described in claim 1 wherein said step of polishing said layer uses a slurry comprising $SiO_2$/KOH.

4. The process as described in claim 1 wherein said layer is deposited to a thickness of approximately 3000–5000 Å.

5. The process as described in claim 1 wherein approximately 100–2000 Å of said layer is removed during said polishing step.

6. The process as described in claim 1 wherein said step of patterning said layer patterns said layer into a gate electrode.

7. A process for improving surface planarity and linewidth control in the manufacture of a gate electrode in a high performance MOS transistor comprising the steps of:

forming an isolation region on a substrate, wherein said isolation region is formed using a technique selected from the group consisting of: LOCOS and shallow trench isolation;

forming a gate dielectric above said substrate and isolation region;

depositing a layer comprising polysilicon above said gate dielectric;

forming a tungsten film on said layer, wherein said tungsten film is deposited onto said layer prior to a step of polishing said layer;

polishing the surface of said layer such that surface roughness and replication of underlying topography are substantially eliminated and such that the polished surface of said layer extends over substantial portions of said isolation region;

patterning said layer into a gate electrode;

forming a source region and a drain region on opposite sides of said gate electrode.

8. The process as described in claim 7 wherein said layer is deposited to a thickness of approximately 3000–5000Å.

9. The process as described in claim 7 wherein said layer further comprises a tungsten silicide film, wherein said tungsten silicide film is formed on said layer comprising polysilicon prior to said step of polishing said layer comprising polysilicon.

10. The process as described in claim 7 wherein said step of polishing said layer uses a slurry comprising SiO2/KOH.

11. The process as described in claim 7; wherein approximately 100–2000 Å of said layer is removed during said polishing step.

12. The process as described in claim 7 wherein said step of polishing said layer comprises:

pressing said substrate onto a polishing pad so that said layer is in contact with said polishing pad, wherein said substrate is pressed onto said polishing pad at a pressure of approximately 0.5–3.0 psi;

dispensing a slurry onto said polishing pad;

rotating said polishing pad relative to said substrate at a rate of approximately 10–100 rpm.

* * * * *

UNITED STATES PATENT AND TRADEMARK OFFICE
CERTIFICATE OF CORRECTION

PATENT NO. : 5,911,111
DATED : June 8, 1999
INVENTOR(S) : Bohr et al.

It is certified that error appears in the above-identified patent and that said Letters Patent is hereby corrected as shown below:

Column 10,
Line 16, delete ";".

Signed and Sealed this

Twenty-ninth Day of June, 2004

JON W. DUDAS
*Acting Director of the United States Patent and Trademark Office*